United States Patent
Chen et al.

(10) Patent No.: US 10,356,932 B2
(45) Date of Patent: Jul. 16, 2019

(54) CABLE MANAGEMENT DEVICE AND CONNECTING ASSEMBLY FOR RACK SYSTEM

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Zong-Sian Wong, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/866,579

(22) Filed: Jan. 10, 2018

(65) Prior Publication Data

US 2019/0053396 A1 Feb. 14, 2019

(30) Foreign Application Priority Data

Aug. 10, 2017 (TW) .............................. 106127401 A (51) Int. Cl.
*H05K 7/14* (2006.01)
*H02G 11/00* (2006.01)

(52) U.S. Cl.
CPC ........... *H05K 7/1491* (2013.01); *H02G 11/00* (2013.01)

(58) Field of Classification Search
CPC .............................. H05K 7/1491; H02G 11/00
See application file for complete search history.

(56) References Cited

U.S. PATENT DOCUMENTS

| | | | |
|---|---|---|---|
| 4,614,383 A * | 9/1986 | Polley | H02B 1/202 |
| | | | 174/69 |
| 6,715,718 B1 | 4/2004 | Chen et al. | |
| 6,902,069 B2 | 6/2005 | Hartman et al. | |
| 7,189,924 B1 * | 3/2007 | Popescu | H05K 7/1491 |
| | | | 174/69 |
| 7,317,623 B2 * | 1/2008 | Nguyen | H02B 1/202 |
| | | | 361/826 |
| 7,472,795 B2 * | 1/2009 | Dubon | H02G 3/128 |
| | | | 211/26 |

(Continued)

FOREIGN PATENT DOCUMENTS

| GB | 2450941 A | 1/2009 |
|---|---|---|
| JP | 2009254156 A | 10/2009 |

*Primary Examiner* — Robert J Hoffberg
*Assistant Examiner* — Hung Q Dang
(74) *Attorney, Agent, or Firm* — Alan D. Kamrath; Mayer & Williams PC (57) ABSTRACT

A cable management device includes a first cable management arm, a second cable management arm, a connecting member and a blocking member. The second cable management arm is movable relative to the first cable management arm. The connecting member is movably connected to the first cable management arm. The blocking member is arranged adjacent to a junction area between the first connecting member and the first cable management arm, and configured to abut against at least one of the first connecting member and the first cable management arm to limit a relative movement between the first connecting member and the first cable management arm to a limited range.

11 Claims, 7 Drawing Sheets

(56) References Cited

U.S. PATENT DOCUMENTS

| | | | |
|---|---|---|---|
| 7,473,846 B2* | 1/2009 | Doerr | H05K 7/1491 |
| | | | 174/68.3 |
| 8,251,321 B2 | 8/2012 | Chen et al. | |
| 8,634,198 B2 | 1/2014 | Chen et al. | |
| 9,668,372 B2 | 5/2017 | Chen et al. | |
| 2007/0045179 A1 | 3/2007 | Nguyen | |
| 2017/0245389 A1* | 8/2017 | Chen | F16L 3/015 |

* cited by examiner

CABLE MANAGEMENT DEVICE AND CONNECTING ASSEMBLY FOR RACK SYSTEM

BACKGROUND OF THE INVENTION

1. Field of the Invention

The present invention relates to a cable management mechanism and, more particularly, to a cable management device and a connecting assembly for a rack system.

2. Description of the Prior Art

A rack system is a rack mounted with an electronic device (such as a server). Generally, two opposite sides of the electronic device are respectively arranged with slide rail assemblies, such that the electronic device can be mounted to the rack through the slide rail assemblies, in order to allow the electronic device to be pulled out of the rack or to be pushed into the rack. The electronic device is usually connected with electronic cables. When the electronic device is pulled out of the rack or pushed into the rack through the slide rail assemblies, a plurality of cable management arms are required to hold and manage the cables neatly.

However, for some market requirements, the cable management arm is required to be moved within a limited range relative to a target object. Therefore, it is important to develop a reliable cable management product to meet market requirements.

SUMMARY OF THE INVENTION

An objective of the present invention is to provide a cable management device having a cable management arm and a connecting member movable relative to each other within a predetermined range.

According to an embodiment of the present invention, a cable management device comprises a first cable management arm, a second cable management arm, a first connecting member and a blocking member. The second cable management arm is movable relative to the first cable management arm. The first connecting member is movably connected to the first cable management arm. The blocking member is arranged adjacent to a junction area between the first connecting member and the first cable management arm, and is configured to abut against at least one of the first connecting member and the first cable management arm to limit a relative movement between the first connecting member and the first cable management arm to a limited range.

Preferably, the first connecting member is pivotally connected to an end of the first cable management arm by a first shaft member.

Preferably, the blocking member is adjacent to the first shaft member. The blocking member has at least one limiting part configured to abut against one of the first connecting member and the first cable management arm when one of the first connecting member and the first cable management arm is moved to a boundary position.

Preferably, the cable management device further comprises a second connecting member pivotally connected to an end of the second cable management arm by a second shaft member.

Preferably, the first cable management arm and the second cable management arm are pivotally connected to each other through a connecting base.

Preferably, the cable management device further comprises at least one supporting member movably connected to a bottom of the connecting base to support the first cable management arm and the second cable management arm.

According to another embodiment of the present invention, a connecting assembly comprises a first slide rail and a first cable management device. The first slide rail assembly comprises a first rail and a second rail movably connected to each other. The first cable management device comprises a first cable management arm, a second cable management arm, a first connecting member and a blocking member. The second cable management arm is movable relative to the first cable management arm. The first connecting member is movably connected to the first cable management arm. The blocking member is arranged adjacent to a junction area between the first connecting member and the first cable management arm, and is configured to abut against at least one of the first connecting member and the first cable management arm to limit a relative movement between the first connecting member and the first cable management arm to a limited range.

Preferably, the first connecting member is pivotally connected to an end of the first cable management arm by a first shaft member.

Preferably, the blocking member is adjacent to the first shaft member. The blocking member has a first limiting part and a second limiting part configured to respectively abut against the first connecting member and the first cable management arm.

Preferably, the connecting assembly further comprises a second connecting member pivotally connected to an end of the second cable management arm by a second shaft member. The second connecting member is configured to connect the second cable management arm to the second rail.

Preferably, the first cable management arm and the second cable management arm are pivotally connected to each other through a connecting base.

Preferably, the connecting assembly further comprises at least one supporting member movably connected to a bottom of the connecting base to support the first cable management arm and the second cable management arm.

Preferably, the connecting assembly further comprises a second slide rail assembly and a second cable management device. The second slide rail assembly comprises a third rail and a fourth rail movably connected to each other. The second cable management device comprises a third cable management arm, a fourth cable management arm movable relative to the third cable management arm, a third connecting member pivotally connected to an end of the third cable management arm and configured to connect the third cable management arm to the third rail, and a fourth connecting member pivotally connected to an end of the fourth cable management arm and configured to connect the fourth cable management arm to the fourth rail.

Preferably, the connecting assembly further comprises a linking member connected to the fourth rail of the second slide rail assembly and the second rail of the first slide rail assembly.

Preferably, the first cable management arm, the second cable management arm, and the at least one supporting member are respectively connected to the first rail, the second rail, and the fourth rail through a first connecting frame, a second connecting frame, and a third connecting frame. Each of the first connecting frame, the second connecting frame and the third connecting frame is extended upward to be higher than the first slide rail assembly and the second slide rail assembly.

According to another embodiment of the present invention, a rack system comprises a rack, a first slide rail assembly, a second slide rail assembly, a carried object, and a first cable management device. The rack has a first side and a second side. The first slide rail assembly is mounted to the first side of the rack. The first slide rail assembly at least comprises a first rail and a second rail, and the first rail is movable relative to the second rail. The second slide rail assembly mounted to the second side of the rack. The second slide rail assembly at least comprises a third rail, and a fourth rail, and the third rail is movable relative to the fourth rail. The carried object is mounted between the first slide rail assembly and the second slide rail assembly. The carried object is movable relative to the rack between a close position and an extension position through the first rail of the first slide rail assembly and the third rail of the second slide rail assembly. The first cable management device comprises a first cable management arm, a second cable management arm and a blocking member. The first cable management arm is detachably connected to one of the carried object and the first rail of the first slide rail assembly through a first connecting member. The second cable management arm is pivotally connected to the first cable management arm, and is detachably connected to one of the rack and the second rail of the first slide rail assembly. The blocking member is arranged adjacent to a junction area between the first connecting member and the first cable management arm, and is configured to abut against at least one of the first connecting member and the first cable management arm to limit a relative movement between the first connecting member and the first cable management arm to a limited range.

These and other objectives of the present invention will no doubt become obvious to those of ordinary skill in the art after reading the following detailed description of the preferred embodiments that are illustrated in the various figures and drawings.

DETAILED DESCRIPTION

Figure 1:
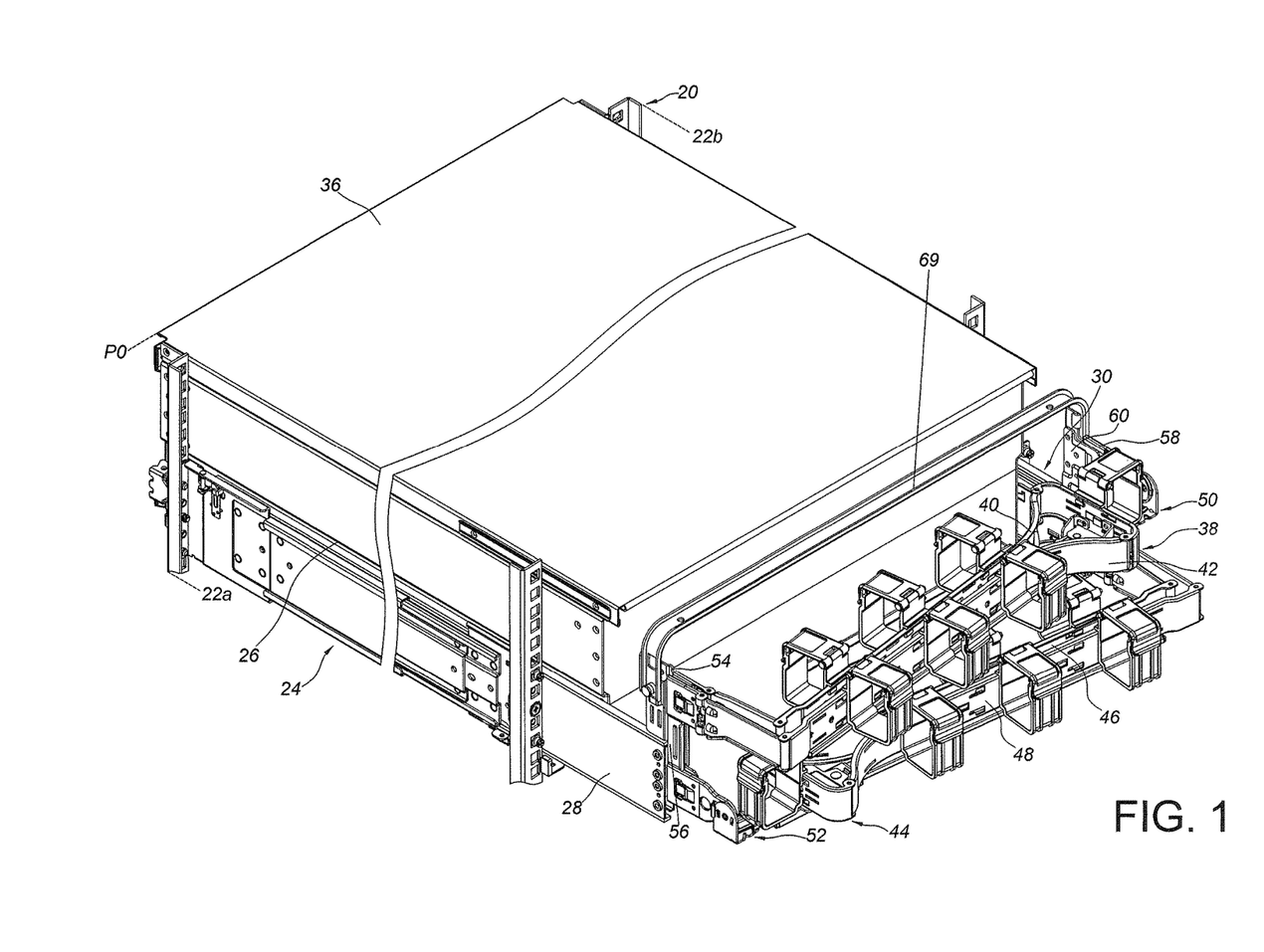
FIG. 1 is a diagram showing a rack system according to an embodiment of the present invention.
Figure 2:
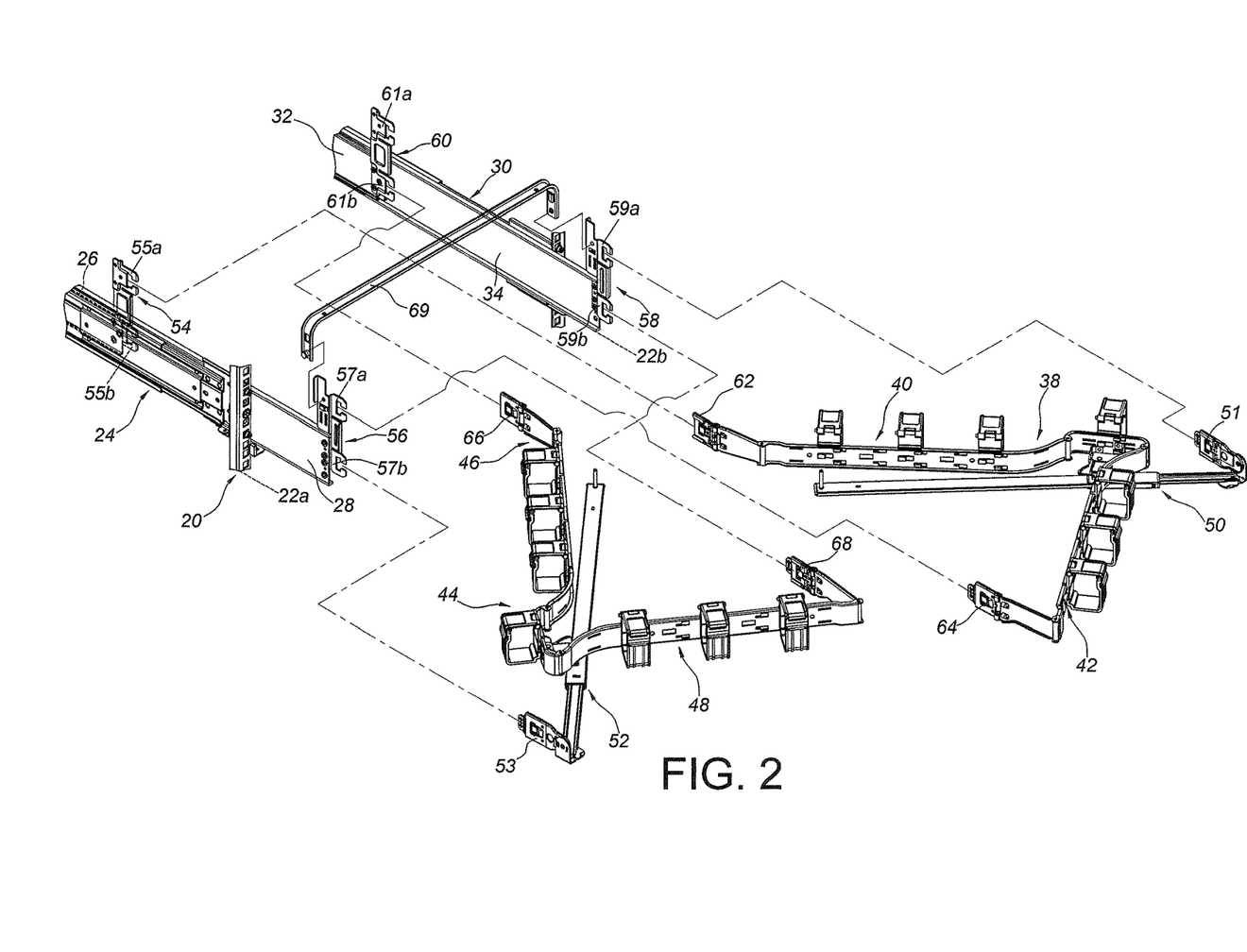
FIG. 2 is an exploded view of two slide rail assemblies, two cable management devices, and a linking member of the rack system according to an embodiment of the present invention.

FIG. 1 and FIG. 2 are diagrams showing a rack system according to an embodiment of the present invention. The rack system comprises a rack 20, a first slide rail assembly 24, a second slide rail assembly 30 and a carried object 36. The rack 20 has a first side 22a and a second side 22b. The first slide rail assembly 24 is mounted to the first side 22a of the rack 20. The first slide rail assembly 24 at least comprises a first rail 26 and a second rail 28 movably connected to each other. In the present embodiment, the second rail 28 is fixedly mounted to the first side 22a of the rack 20, and the first rail 26 is movable relative to the second rail 28. The second slide rail assembly 30 is mounted to the second side 22b of the rack 20. The second slide rail assembly 30 and the first slide rail assembly 24 are substantially arranged in parallel. The second slide rail assembly 30 at least comprises a third rail 32 and a fourth rail 34 movably connected to each other. In the present embodiment, the fourth rail 34 is fixedly mounted to the second side 22b of the rack 20, and the third rail 32 is movable relative to the fourth rail 34. The carried object 36 can contain a hard disk, a power distribution unit and/or other electronic components. The carried object 36 is mounted between the first slide rail assembly 24 and the second slide rail assembly 30. The carried object 36 is movable relative to the rack 20 between a close position (such as a front part P0 of the carried object 36 being adjacent to a front post of the rack 20) and an extension position (please refer to FIG. 8 and FIG. 9) through the first rail 26 of the first slide rail assembly 24 and the third rail 32 of the second slide rail assembly 30. The rack system further comprises a first cable management device 38 and a second cable management device 44. The first cable management device 38 comprises a first cable management arm 40 and a second cable management arm 42 movable relative to the first cable management arm 40. Preferably, the second cable management device 44 comprises a third cable management arm 46 and a fourth cable management arm 48 movable relative to the third cable management arm 46.

Preferably, the rack system further comprises at least one first supporting member 50 and at least one second supporting member 52 configured to respectively support the first cable management device 38 and the second cable management device 44.

Preferably, the rack system further comprises a first connecting frame 54, a second connecting frame 56, a third connecting frame 58 and a fourth connecting frame 60 respectively connected to the first rail 26, the second rail 28, the fourth rail 34 and the third rail 32. Each of the first connecting frame 54, the second connecting frame 56, the third connecting frame 58 and the fourth connecting frame 60 is extended upward to be higher than the first slide rail assembly 24 (or the second slide rail assembly 30). Specifically, the first connecting frame 54 has an upper part 55a and a lower part 55b. The second connecting frame 56 has an upper part 57a and a lower part 57b. The third connecting frame 58 has an upper part 59a and a lower part 59b. The fourth connecting frame 60 has an upper part 61a and a lower part 61b. Preferably, the first connecting frame 54, the second connecting frame 56, the third connecting frame 58 and the fourth connecting frame 60 are respectively fixedly connected to the first rail 26, the second rail 28, the fourth rail 34 and the third rail 32. Therefore, the first connecting frame 54 can be seen as a portion of the first rail 26, the second connecting frame 56 can be seen as a portion of the second rail 28, the third connecting frame 58 can be seen as a portion of the fourth rail 34, and the fourth connecting frame 60 can be seen as a portion of the third rail 32.

Specifically, the first cable management arm 40 is detachably connected to one of the carried object 36 and the first rail 26 of the first slide rail assembly 24 through a first connecting member 62. The first connecting member 62 is movably connected to the first cable management arm 40. In the present embodiment, the first cable management arm 40 is detachably connected to the upper part 55a of the first connecting frame 54 through the first connecting member 62, such that the first cable management arm 40 is mounted to the first rail 26 and located above the first rail 26. In another embodiment, the first connecting frame 54 can be arranged on the carried object 36, but the present invention is not limited thereto.

The first cable management arm 40 and the second cable management arm 42 can be expanded (please refer to FIG. 8 and FIG. 9) or folded (please refer to FIG. 1). The second cable management arm 42 is detachably connected to one of the rack 20 and the second rail 28 of the first slide rail assembly 24 through a second connecting member 64. The second connecting member 64 is movably connected to the second cable management arm 42. In the present embodiment, the second cable management arm 42 is detachably connected to the upper part 57a of the second connecting frame 56 through the second connecting member 64, such that the second cable management arm 42 is mounted to the second rail 28 and located above the second rail 28. In another embodiment, the second connecting frame 56 can be arranged on the rack 20, but the present invention is not limited thereto.

A first connecting part 51 of the at least one first supporting member 50 is detachably connected to the upper part 59a of the third connecting frame 58, such that the at least one first supporting member 50 is mounted to the fourth rail 34 and located above the fourth rail 34. In the present embodiment, the at least one first supporting member 50 has two supporting elements retractable relative to each other.

Similarly, the third cable management arm 46 is detachably connected to one of the carried object 36 and the third rail 32 of the second slide rail assembly 30 through a third connecting member 66. The third connecting member 66 is movably connected to the third cable management arm 46. In the present embodiment, the third cable management arm 46 is detachably connected to the lower part 61b of the fourth connecting frame 60 through the third connecting member 66, such that the third cable management arm 46 is mounted to the third rail 32. In another embodiment, the fourth connecting frame 60 can be arranged on the carried object 36, but the present invention is not limited thereto.

The third cable management arm 46 and the fourth cable management arm 48 can be expanded (please refer to FIG. 8 and FIG. 9) or folded (please refer to FIG. 1). The fourth cable management arm 48 is detachably connected to one of the rack 20 and the fourth rail 34 of the second slide rail assembly 30 through a fourth connecting member 68. The fourth connecting member 68 is movably connected to the fourth cable management arm 48. In the present embodiment, the fourth cable management arm 48 is detachably connected to the lower part 59b of the third connecting frame 58 through the fourth connecting member 68, such that the fourth cable management arm 48 is mounted to the fourth rail 34. In another embodiment, the third connecting frame 58 can be arranged on the rack 20, but the present invention is not limited thereto.

A second connecting part 53 of the at least one second supporting member 52 is detachably connected to the lower part 57b of the second connecting frame 56, such that the at least one second supporting member 52 is mounted to the second rail 28. In the present embodiment, the at least one second supporting member 52 has two supporting elements retractable relative to each other.

According to the above arrangement, the first cable management device 38 is arranged above the second cable management device 44. That is, the rack system comprises the up-down arranged, first and second cable management devices 38, 44 configured to manage or accommodate cables behind the carried object 36. The first slide rail assembly 24 and the first cable management device 38 forms a connecting assembly. Preferably, the connecting assembly further comprises the second slide rail assembly 30 and the second cable management device 44.

In addition, the fourth rail 34 of the second slide rail assembly 30 and the second rail 28 of the first slide rail assembly 24 are connected to each other through a linking member 69. Preferably, two sides of the linking member 69 are respectively connected to the second connecting frame 56 and the third connecting frame 58 and adjacent to the upper part of the second connecting frame 56 and the upper part of the third connecting frame 58.

Figure 3:
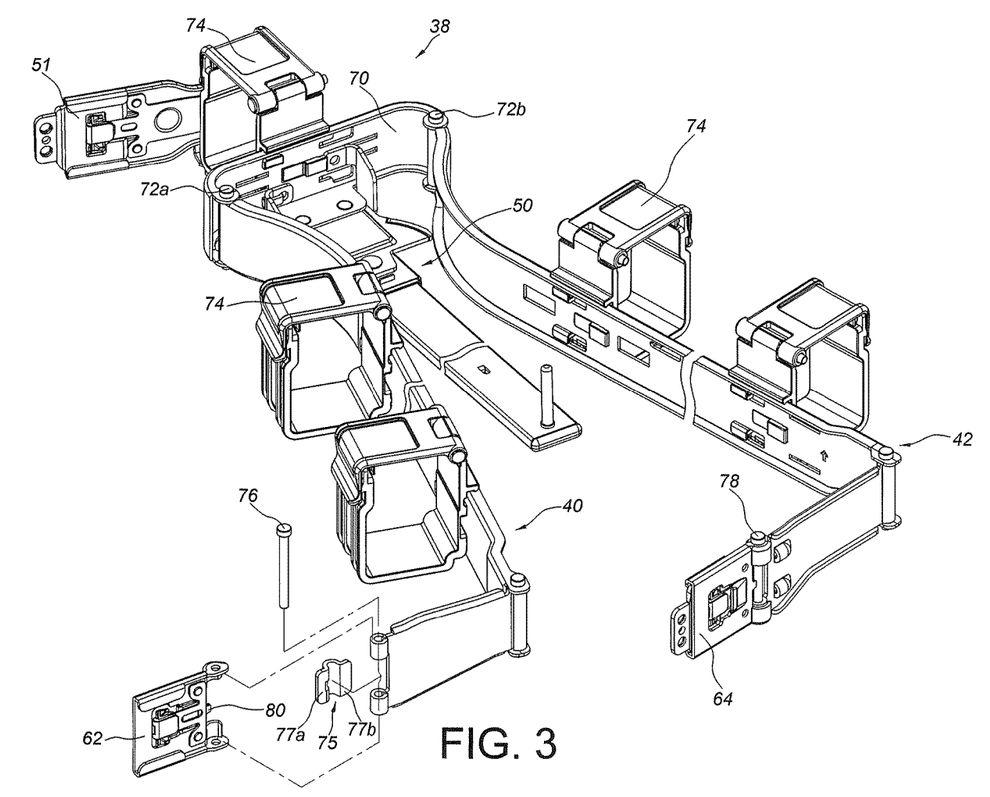
FIG. 3 is diagram showing a cable management device with a connecting member detached from a cable management arm according to an embodiment of the present invention.
Figure 4:
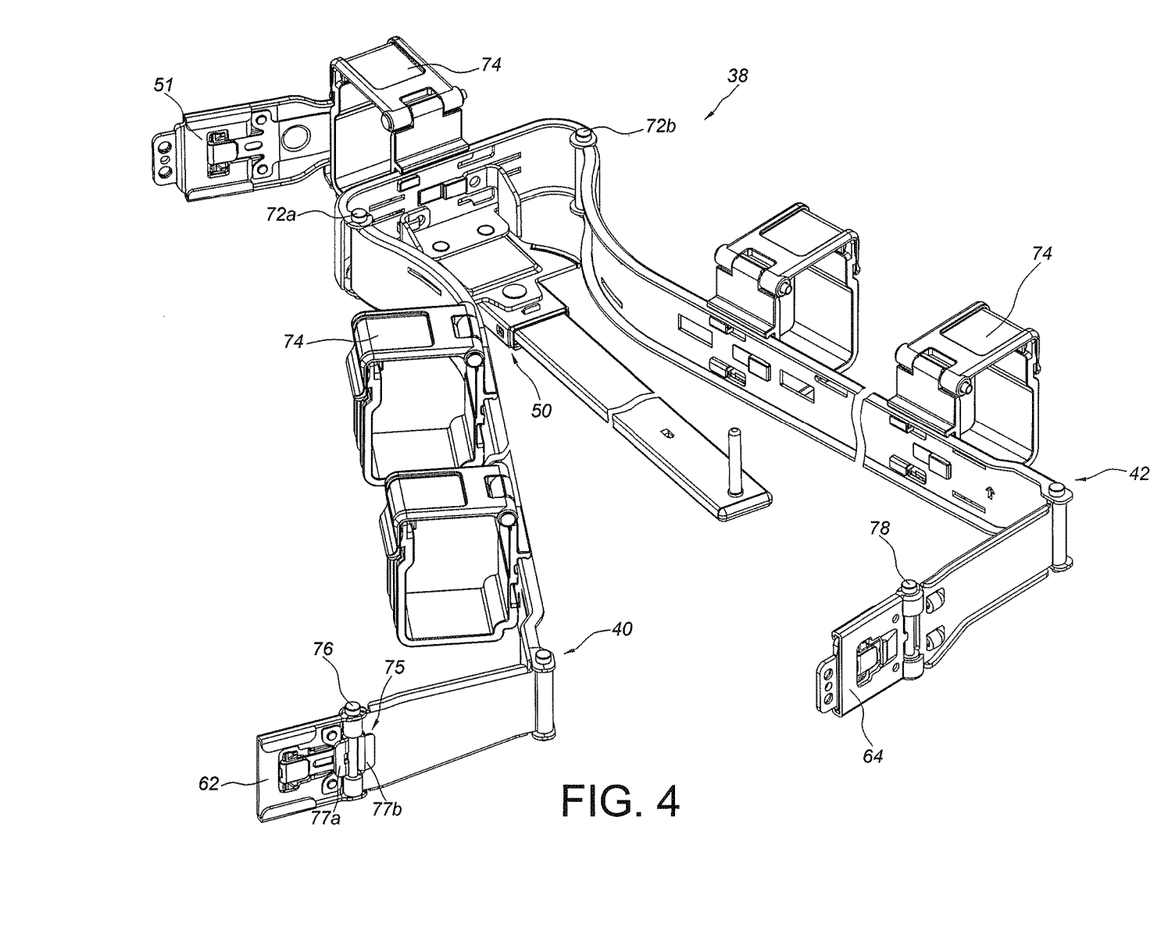
FIG. 4 is a diagram showing the cable management device according to an embodiment of the present invention.

As shown in FIG. 3 and FIG. 4, the first cable management arm 40 and the second cable management arm 42 of the first cable management device 38 are pivotally connected to each other through a connecting base 70. Specifically, the first cable management arm 40 and the second cable management arm 42 are respectively pivotally connected to the connecting base 70 through pin 72a and pin 72b, such that the connecting base 70 is arranged between the first cable management arm 40 and the second cable management arm 42. The first cable management arm 40 and the second cable management arm 42 are arranged with a plurality of cable accommodation units 74 spaced from each other and configured to accommodate related cables of the carried object 36.

Furthermore, the first cable management device 38 further includes a blocking member 75 configured to abut against at least one of the first connecting member 62 and the first cable management arm 40 to limit a relative movement between the first connecting member 62 and the first cable management arm 40 to a limited range. Preferably, the first connecting member 62 is pivotally connected to an end of the first cable management arm 40 by a first shaft member 76. The blocking member 75 is adjacent to the first shaft member 76. For example, the blocking member 75 is an additional component mounted to one side of the first shaft member 76. The blocking member 75 has at least one limiting part configured to abut against one of the first connecting member 62 and the first cable management arm 40 when one of the first connecting member 62 and the first cable management arm 40 is moved to a boundary position. In the present embodiment, the blocking member 75 has a first limiting part 77a and a second limiting part 77b configured to respectively abut against the first connecting member 62 and the first cable management arm 40. Similarly, the second connecting member 64 is pivotally connected to an end of the second cable management arm 42 by a second shaft member 78. On the other hand, the at least one first supporting member 50 is configured to support a bottom of the first cable management device 38. In the present embodiment, the at least one first supporting member 50 is movably connected to a bottom of the connecting base 70 in order to support the first cable management arm 40 and the second cable management arm 42. Moreover, the configuration of the second cable management arm 42 is substantially identical to the configuration of the first cable management arm 40. For simplicity, no further illustration is provided.

Figure 5:
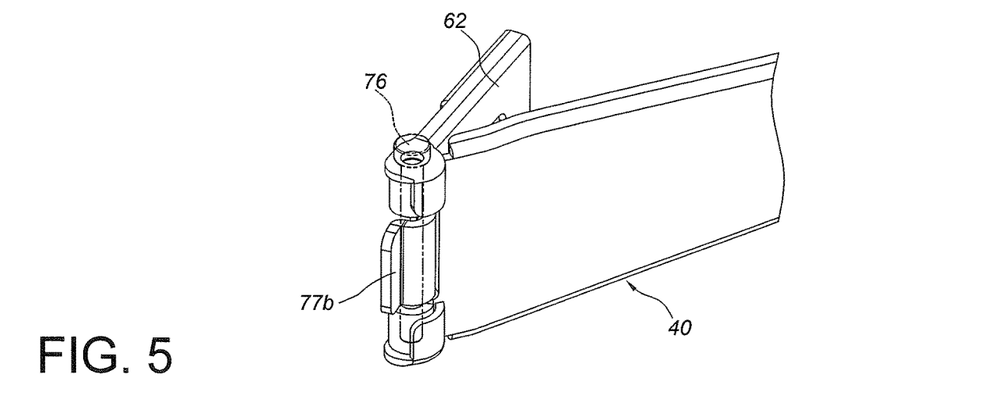
FIG. 5 is a diagram showing the connecting member and the cable management arm of the cable management device in a first state according to an embodiment of the present invention.
Figure 6:
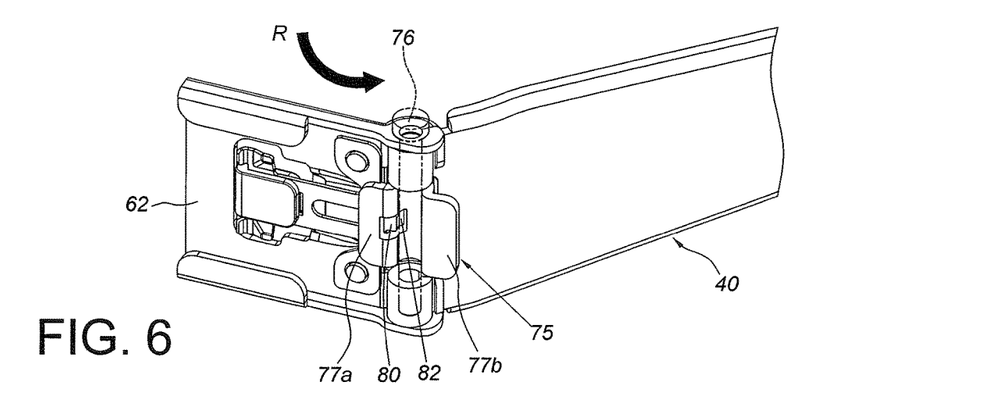
FIG. 6 is a diagram showing the connecting member and the cable management arm of the cable management device moved relative to each other to be in a second state according to an embodiment of the present invention.
Figure 7:
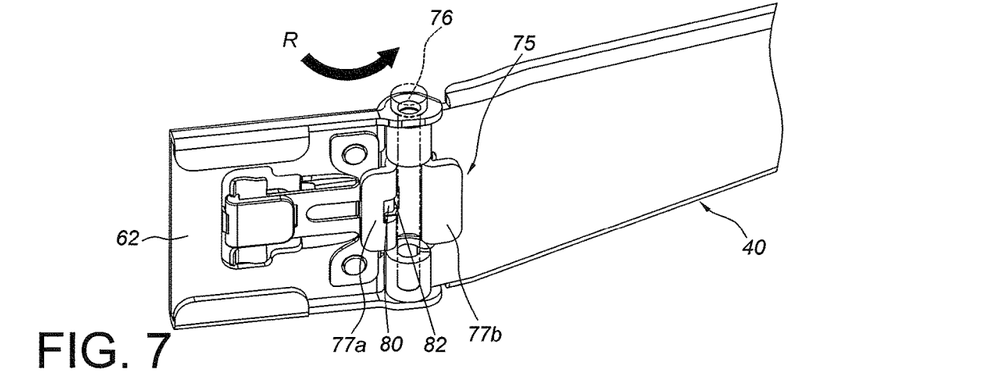
FIG. 7 is a diagram showing the connecting member and the cable management arm of the cable management device moved relative to each other to be in a third state according to an embodiment of the present invention.

As shown in FIG. 5, FIG. 6 and FIG. 7, the first and second limiting parts 77a, 77b of the blocking member 75 are configured to respectively abut against the first connecting member 62 and the first cable management arm 40. According to such arrangement, when the first connecting member 62 is rotated relative to the first cable management arm 40, an angle between the first connecting member 62 and the first cable management arm 40 can be limited.

In the present embodiment, the first connecting member 62 and the first limiting part 77a respectively have a first structure 80 and a second structure 82 corresponding to each other. The first structure 80 and the second structure 82 can respectively be a protruded structure and a recessed structure (or hole), or vise versa, but the present invention is not limited thereto. The recessed structure (or hole) allows the protruded structure to pass through, in order to prevent the protruded structure on the first connecting member 62 from interfering with the blocking member 75.

According to such arrangement, when the first connecting member 62 is rotated relative to the first cable management arm 40 along a rotation direction R to a predetermined position, such as a boundary position, the first connecting member 62 abuts against the first cable management arm 40 through the first limiting part 77a and the second limiting part 77b of the blocking member 75 (as shown in FIG. 7), such that the first connecting member 62 can not be further rotated relative to the first cable management arm 40 along the rotation direction R. In other words, the blocking member 75 limits a relative movement between the first connecting member 62 and the first cable management arm 40 to a limited range.

Figure 8:
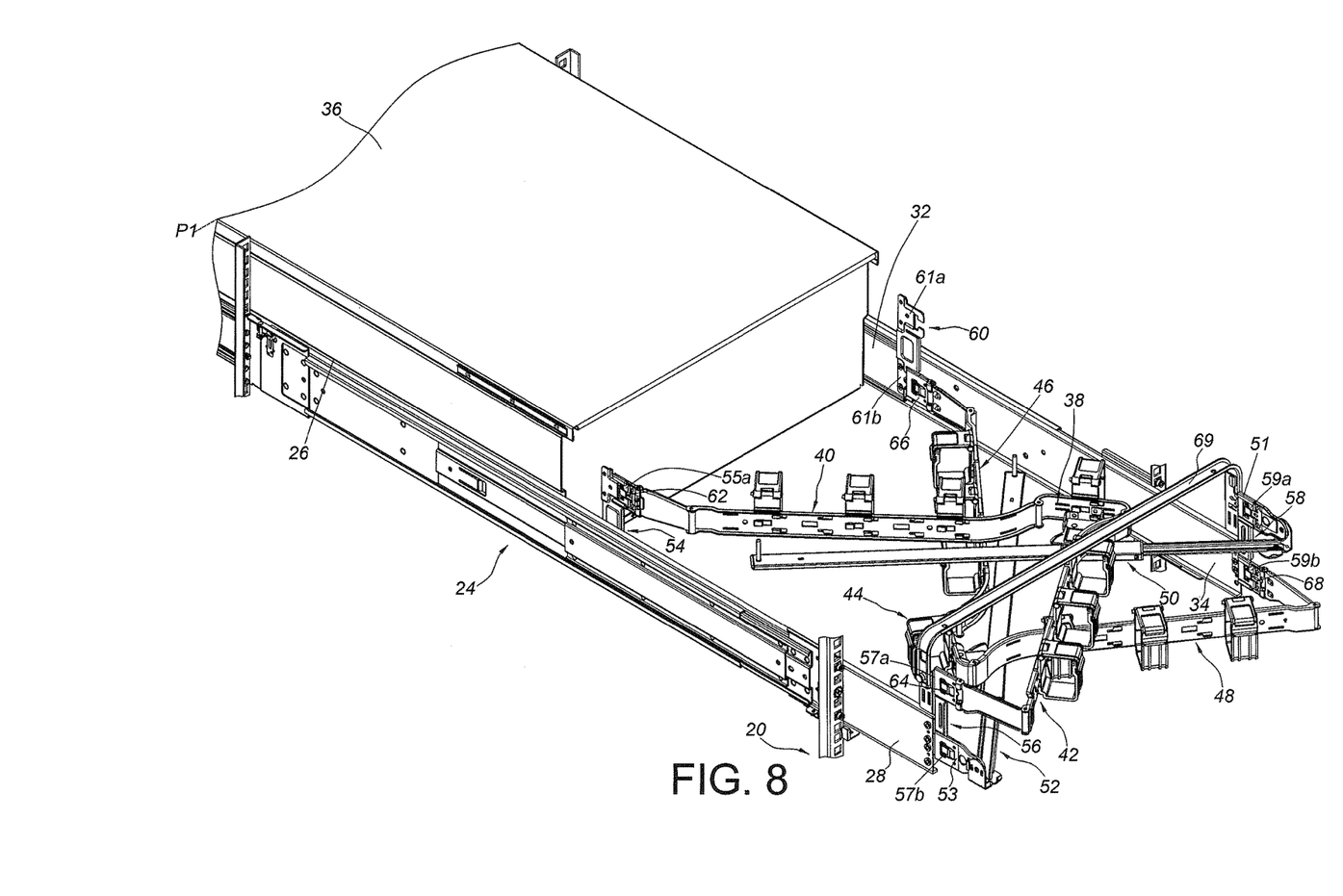
FIG. 8 is a diagram showing a carried object pulled out relative to a rack from a close position to a first position according to an embodiment of the present invention.

As shown in FIG. 8, when the first rail 26 and the third rail 32 are extended outward respectively relative to the second rail 28 and the fourth rail 34, the carried object 36 is moved relative to the rack 20 to a first extension position (such as a middle part P1 of the carried object 36 adjacent to the front post of the rack 20) through the first rail 26 and the third rail 32.

The first cable management arm 40 and the second cable management arm 42 of the first cable management device 38 are gradually expanded. The at least one first supporting member 50 is configured to support one of the first cable management arm 40 and the second cable management arm 42. Similarly, the third cable management arm 46 and the fourth cable management arm 48 of the second cable management device 44 are gradually expanded as well. The at least one second supporting member 52 is configured to support one of the third cable management arm 46 and the fourth cable management arm 48.

Figure 9:
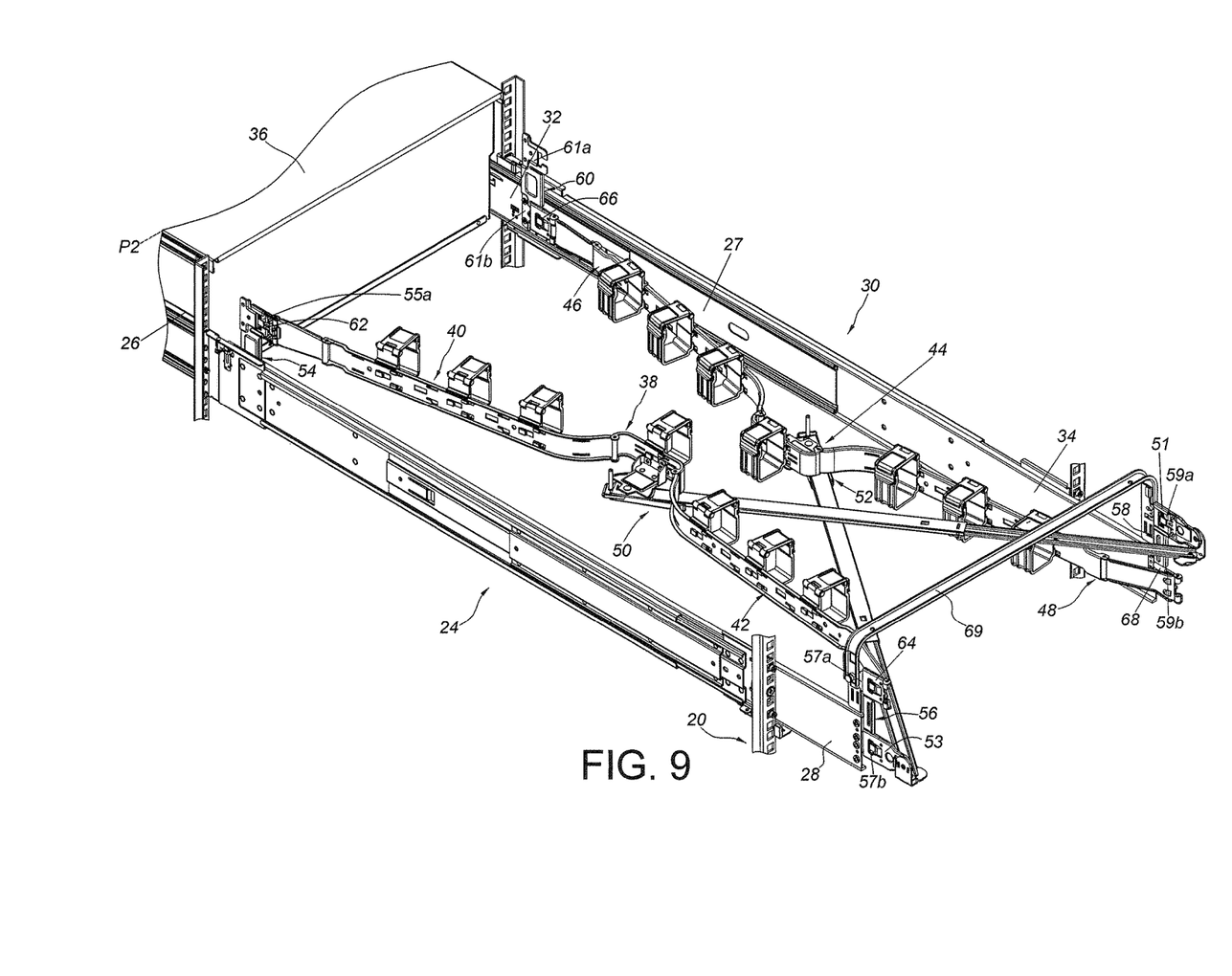
FIG. 9 is a diagram showing the carried object further pulled out relative to the rack to a second position.

As shown in FIG. 9, when the first rail 26 and the third rail 32 are further extended outward respectively relative to the second rail 28 and the fourth rail 34, the carried object 36 is further moved relative to the rack 20 to a second extension position (such as a rear part P2 of the carried object 36 being adjacent to the front post of the rack 20) through the first rail 26 and the third rail 32.

In addition, the first cable management arm 40 and the second cable management arm 42 of the first cable management device 38 are further expanded. Similarly, the third cable management arm 46 and the fourth cable management arm 48 of the second cable management device 44 are further expanded as well.

When the first cable management device 38 and/or the second cable management device 44 are expanded, the linking member 69 can improve structure stability and enhance structure strength between the second rail 28 and the fourth rail 34.

Preferably, each of the first slide rail assembly 24 and the second slide rail assembly 30 further comprises a middle rail 27 configured to respectively extend a traveling distance of the first rail 26 relative to the second rail 28 and a traveling distance of the third rail 32 relative to the fourth rail 34.

Therefore, the present invention is characterized in that:
1. The relative movement between the connecting member and the cable management arm can be limited by the blocking member of the cable management device.
2. When the first cable management device and/or the second cable management device is expanded or folded, the linking member can improve structure stability and enhance structure strength between the second rail and the fourth rail.

Those skilled in the art will readily observe that numerous modifications and alterations of the device and method may be made while retaining the teachings of the invention. Accordingly, the above invention should be construed as limited only by the metes and bounds of the appended claims.

What is claimed is:
1. A connecting assembly comprising:
   a first slide rail assembly comprising a first rail and a second rail movably connected to each other; and
   a first cable management device comprising:
      a first cable management arm;
      a second cable management arm movable relative to the first cable management arm; a first connecting member movably connected to the first cable management arm and configured to connect the first cable management arm to the first rail; and a blocking member arranged adjacent to a junction area between the first connecting member and the first cable management arm, and configured to abut against at least one of the first connecting member and the first cable management arm to limit a relative movement between the first connecting member and the first cable management arm to a limited range;
      wherein the first connecting member is pivotally connected to an end of the first cable management arm by a first shaft member; and wherein the blocking member is adjacent to the first shaft member, and wherein the blocking member has a first limiting part and a second limiting part configured to respectively abut against the first connecting member and the first cable management arm.

2. The connecting assembly of claim 1, further comprising a second connecting member pivotally connected to an end of the second cable management arm by a second shaft member and configured to connect the second cable management arm to the second rail.

3. The connecting assembly of claim 1, wherein the first cable management arm and the second cable management arm are pivotally connected to each other through a connecting base.

4. The connecting assembly of claim 3, further comprising at least one supporting member movably connected to a bottom of the connecting base to support the first cable management arm and the second cable management arm.

5. The connecting assembly of claim 4, further comprising a second slide rail assembly and a second cable management device, wherein the second slide rail assembly comprises a third rail and a fourth rail movably connected to each other, wherein the second cable management device comprises a third cable management arm, a fourth cable management arm movable relative to the third cable management arm, a third connecting member pivotally connected to an end of the third cable management arm and configured to connect the third cable management arm to the third rail, and a fourth connecting member pivotally connected to an end of the fourth cable management arm and configured to connect the fourth cable management arm to the fourth rail.

6. The connecting assembly of claim 5, further comprising a linking member connected to the fourth rail of the second slide rail assembly and the second rail of the first slide rail assembly.

7. The connecting assembly of claim 5, wherein the first cable management arm, the second cable management arm, and the at least one supporting member are respectively connected to the first rail, the second rail, and the fourth rail through a first connecting frame, a second connecting frame, and a third connecting frame; and each of the first connecting frame, the second connecting frame and the third connecting frame is extended upward to be higher than the first slide rail assembly and the second slide rail assembly.

8. A rack system comprising:
a rack having a first side and a second side;
a first slide rail assembly mounted to the first side of the rack, with the first slide rail assembly comprising a first rail and a second rail, wherein the first rail is movable relative to the second rail;
a second slide rail assembly mounted to the second side of the rack, with the second slide rail assembly comprising a third rail and a fourth rail, wherein the third rail is movable relative to the fourth rail;
a carried object mounted between the first slide rail assembly and the second slide rail assembly, with the carried object movable relative to the rack between a close position and an extension position through the first rail of the first slide rail assembly and the third rail of the second slide rail assembly; and
a first cable management device comprising:
a first cable management arm detachably connected to one of the carried object and the first rail of the first slide rail assembly through a first connecting member;
a second cable management arm pivotally connected to the first cable management arm, and detachably connected to one of the rack and the second rail of the first slide rail assembly; and
a blocking member arranged adjacent to a junction area between the first connecting member and the first cable management arm, and configured to abut against at least one of the first connecting member and the first cable management arm to limit a relative movement between the first connecting member and the first cable management arm to a limited range;
wherein the first connecting member is pivotally connected to an end of the first cable management arm by a first shaft member, wherein the blocking member is adjacent to the first shaft member, and wherein the blocking member has a first limiting part and a second limiting part configured to respectively abut against the first connecting member and the first cable management arm.

9. The rack system of claim 8, further comprising a second connecting member pivotally connected to an end of the second cable management arm by a second shaft member, wherein the second cable management arm is detachably connected to one of the rack and the second rail of the first slide rail assembly through the second connecting member.

10. The rack system of claim 8, wherein the first cable management arm and the second cable management arm are pivotally connected to each other through a connecting base, and wherein the rack system further comprises at least one supporting member movably connected to a bottom of the connecting base to support the first cable management arm and the second cable management arm.

11. The rack system of claim 8, further comprising a second cable management device, wherein the second cable management device comprises a third cable management arm, a fourth cable management arm movable relative to the third cable management arm, a third connecting member movably connected to the third cable management arm and configured to detachably connect the third cable management arm to one of the carried object and the third rail of the second slide rail assembly, and a fourth connecting member movably connected to the fourth cable management arm and configured to detachably connect the fourth cable management arm to one of the rack and the fourth rail of the second slide rail assembly.

* * * * *